United States Patent [19]

Thomasson

[11] Patent Number: 5,467,016
[45] Date of Patent: Nov. 14, 1995

[54] SATURATION SELECTIVE SPECTROSCOPIC IMAGING

[75] Inventor: David M. Thomasson, Edison, N.J.

[73] Assignee: Siemens Medical Systems, Inc., Iselin, N.J.

[21] Appl. No.: 49,466

[22] Filed: Apr. 20, 1993

[51] Int. Cl.$^6$ .................................................. G01V 3/00
[52] U.S. Cl. ............................................ 324/309; 324/307
[58] Field of Search .................................. 324/300, 306, 324/307, 309, 314

[56] References Cited

U.S. PATENT DOCUMENTS

| | | | |
|---|---|---|---|
| 4,021,726 | 5/1977 | Garroway et al. | 324/5 |
| 4,319,190 | 3/1982 | Brown | 324/309 |
| 4,506,223 | 3/1985 | Bottomley et al. | 324/309 |
| 4,629,988 | 12/1986 | Bottomley | 324/309 |
| 4,814,709 | 3/1989 | Takeda et al. | 324/309 |
| 4,816,764 | 3/1989 | Weber et al. | 324/309 |
| 4,891,595 | 1/1990 | Granot | 324/309 |
| 4,924,183 | 5/1990 | Kunz et al. | 324/309 |

FOREIGN PATENT DOCUMENTS 0097519 of 0000 United Kingdom.
0086306 of 0000 United Kingdom.

OTHER PUBLICATIONS

Patent Abstract from Japan, vol. 10 No. 282 (P–500 (2338) entitled: "Nuclear Magetic Resonance Device".
Phys. Med. Biol., 1985, vol. 30, No. 8 entitled: "Magnets, molecules and medicine" pp. 741–770 (1985).
"Physics in Medicine & Biology", pp. 766–768 (1985).
Journal of Magnetic Resonance 59, "Depth–Resolved Surface–Coil Spectroscopy (DRESS) for in Vivo$^1$H, $^{31}$P, and$^{13}$C NMR."pp. 338–342 (1984).
Addison–Wesley Publishing Company, Inc. "Experimental Pulse NMR, A Nuts and Bolts Approach", pp. 174–176 (1981).
Academic Press, "Advances in Magnetic Resonance", NMR Imaging in Biomedicine. pp. 92–93 (1982).

*Primary Examiner*—Louis Arana
*Attorney, Agent, or Firm*—Mark H. Jay

[57] ABSTRACT

In order to spatially localize NMR Spectroscopic signals that are acquired at minimum time post excitation, a saturation selective spectroscopic imaging technique combines the use of saturation regions to define a region of interest; and RF pulse to generate a free induction decay (FID) signal; and phase encoding steps to spatially localize the signal within the non-saturated region.

4 Claims, 5 Drawing Sheets

SATURATION SELECTIVE SPECTROSCOPIC IMAGING

BACKGROUND OF THE INVENTION

1. Field of the Invention

The present invention is directed to methods for identifying nuclear magnetic spectra from spatially selectable regions of an examination subject which is disposed in a fundamental magnetic field and varying gradient fields as well as being subjected to a sequence of RF pulses for exciting nuclear magnetic resonance metabolites in the subject.

2. Related Art

Nuclear magnetic resonance devices are known in the art wherein nuclear magnetic resonance signals are obtained from an examination subject which is disposed in a fundamental magnetic field and various gradient fields and which has been subjected to a sequence of RF pulses. The resulting nuclear magnetic resonance signals are acquired using a coil disposed in the proximity of the examination region, and spatial selection is achieved by superimposing the transmission/reception characteristic of the coil with a selective slice excitation signal obtained by the combination of a selected gradient field and a frequency-selective RF pulse.

Full topical resolution is generally not employed in nuclear magnetic spectroscopy. The demarcation of individual volume regions of an examination subject, for example, an organ, is desired. In a method known from an article by Bottomly et al. in the Journal of Magnetic Resonance, Vol. 59, 1984, pages 338–342, the desired volume is selectively excited for this purpose. The reception as well as the transmission of the nuclear magnetic resonance signals occurs by means of a surface coil applied to the examination subject. The reception characteristic and the transmission characteristic of the surface coil are thereby used in combination for the volume selection. Then, during the selective excitation, a slice is selected by connecting a magnetic field gradient. A portion of the slice can then be selected on the basis of the characteristic of the surface coil.

This known method, however, presents problems for spectroscopy of compounds having a short relaxation time $T_2$. This is because the selective excitation necessarily lasts a relatively long time. This relatively long selective excitation time is a consequence of the fact that an RF pulse having a bandwidth corresponding to the slice thickness must be used. The free induction decay (FID) signal, which cannot be interpreted until the end of the excitation, has thus already decayed to a relatively great degree given their short $T_2$ times. This is particularly true for in-vivo phosphorus spectroscopy.

It is known from U.S. Pat. No. 4,021,726 that spatial selection for imaging a selected slice of an examination subject can be achieved by saturation (canceling) all spins except those in the selected slice. Read-out of the desired information is accomplished using a 90 degree excitation pulse, which is applied simultaneously with a read-out gradient. This method, however, is not suitable for spectroscopy because the presence of the read-out gradient would destroy the spectral information.

It is known from U.S. Pat. No. 4,816,764, that spatial presaturation pulses may be used to selectively saturate spins adjacent to a surface coil away from an area of interest. The employed method, however, spoils the signal in one area away from the coil and therefore provides only one degree of spatial selection.

It is known from U.S. Pat. No. 4,319,90 that one method of implementing additional degree of spatial localization for spectroscopic data acquisition employs additional phase encoding of the received signal. This phase encoding is subsequently transformed into a spatial encoding with some post-processing steps (e.g. a Fourier transform). The disadvantage of this technique is that only phase encoding is used for spatial localization. For some examinations, spectroscopic signals may be obscured due to high signals adjacent to volumes of interest.

In order to further localize spectroscopic signals which are spatially encoded using the above-described method, a hybrid technique was employed which uses a series of selective pulses to delineate a selected voxal of interest. This selected voxal was further subdivided by the phase encoding method described above. The disadvantage of this technique is that it can require a relatively long period of time to select the voxal of interest to be further spatially encoded. During this time, much signal is lost due to the $T_1$ and $T_2$ decay processes.

SUMMARY OF THE INVENTION

In order to spatially localize NMR Spectroscopic signals that are acquired at minimum time post excitation, a saturation selective spectroscopic imaging technique combines the use of saturation regions to define a region of interest; and RF pulse to generate a free induction decay (FID) signal; and phase encoding steps to spatially localize the signal within the non-saturated region.

BRIEF DESCRIPTION OF THE DRAWING

The invention will be better understood by reference to the drawing, wherein.

Like reference numeral appearing in more than one figure represent like elements.

DETAILED DESCRIPTION OF THE PREFERRED EMBODIMENTS

Figure 1:
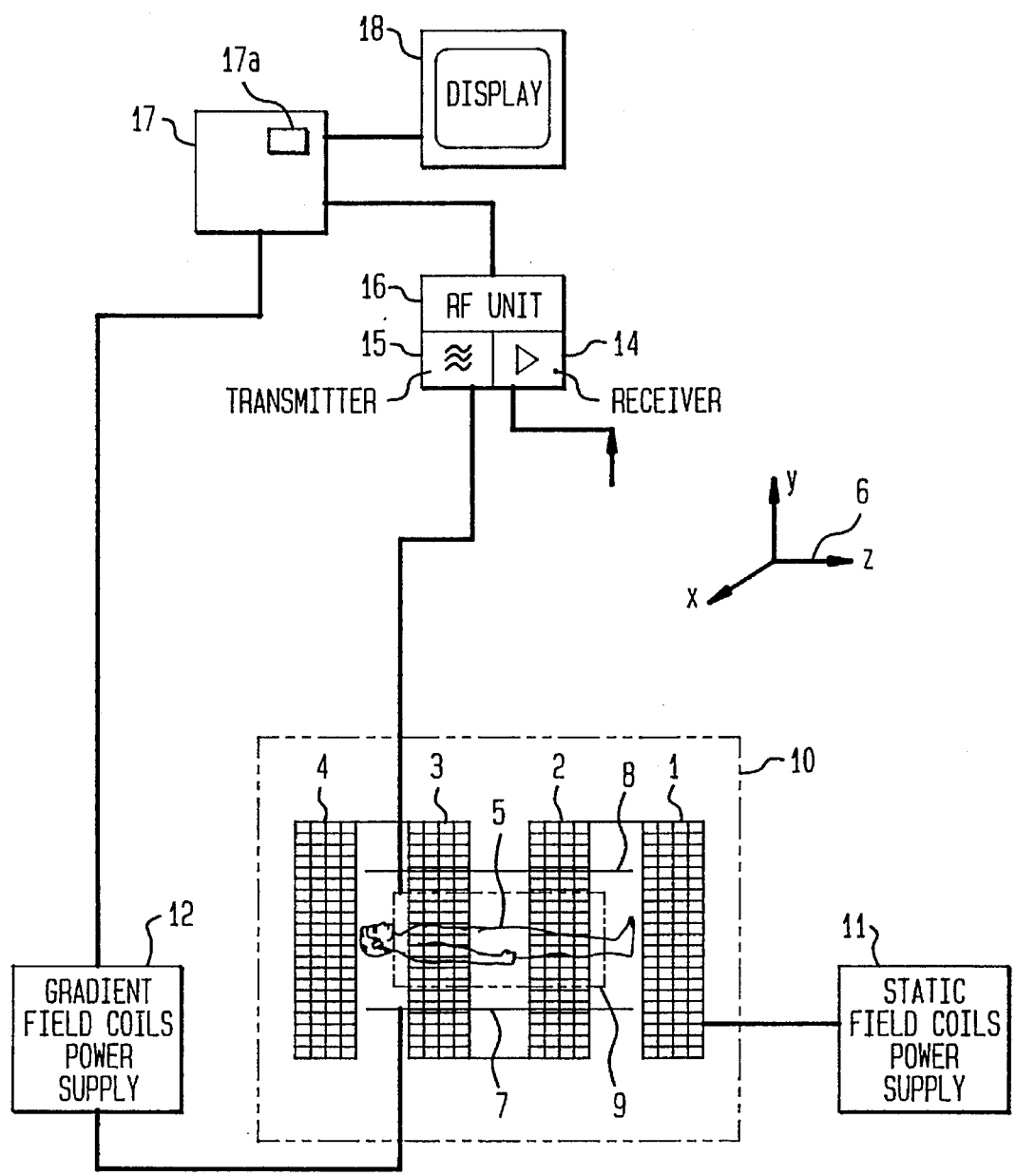
FIG. 1 is a schematic diagram showing a nuclear magnetic resonance apparatus for magnetic spectroscopy for practicing the method disclosed herein.

The basic structure of a nuclear magnetic resonance device for producing nuclear magnetic spectra of an examination subject is shown in FIG. 1. A fundamental magnetic field is generated by coils 1, 2, 3 and 4 in which an examination subject 5 is disposed in magnetic field gradients which are generated by a separate set of coils. Gradient coils 7 and 8 are shown in the drawing, which generate a magnetic field gradient in the y direction in accordance with the axes indicated at 6. Other gradient coils (not shown) are present for generating gradient field in the z and x directions. The apparatus also includes a whole body antennae 9 for generating the nuclear magnetic resonance signals.

The coils 1, 2, 3, 4, 7, 8 and 9 bounded by the dot-dash line represent the portion of the device in which the patient is disposed. The coils therein are operated by a power supply 11 for the coils 1, 2, 3 and 4, and a power supply 12 for the coils 7 and 8 (and other gradient coils not shown). A coil for receiving the nuclear magnetic resonance signals (not shown in FIG. 1) is coupled to a control computer 17 through a signal amplifier 14. The control computer 17 includes program code 17a for generating the excitation sequence of FIG. 3 and generates an output of the spectra on a display device 18. The whole body antenna 9 is connected to an RF transmitter 15. The components 14 and 15 are part of an RF transmitter/receiver unit for signal generation and pick-up.

Figure 2:
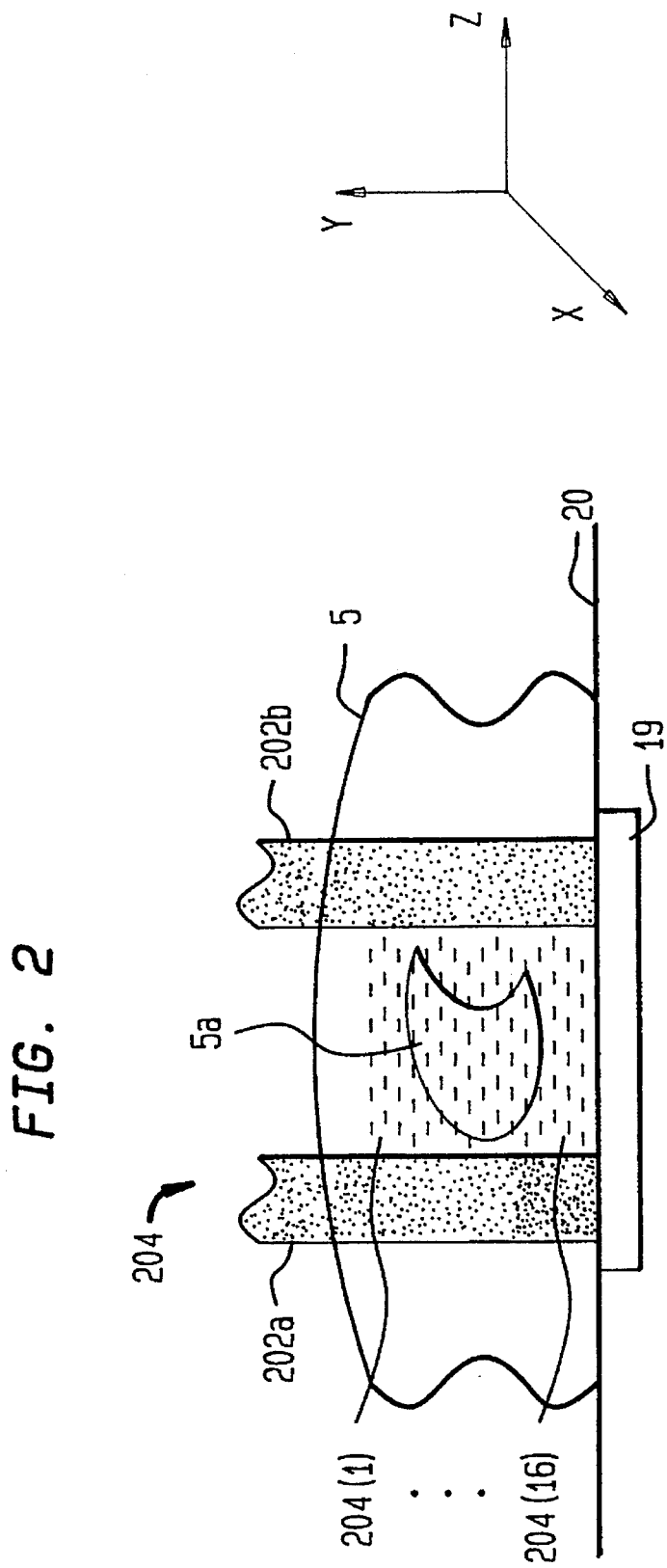
FIG. 2 is a schematic showing of the selective saturation of a volume within an examination subject. The volume within is further divided into slab sections which are separated using phase encoding.
Figure 3:
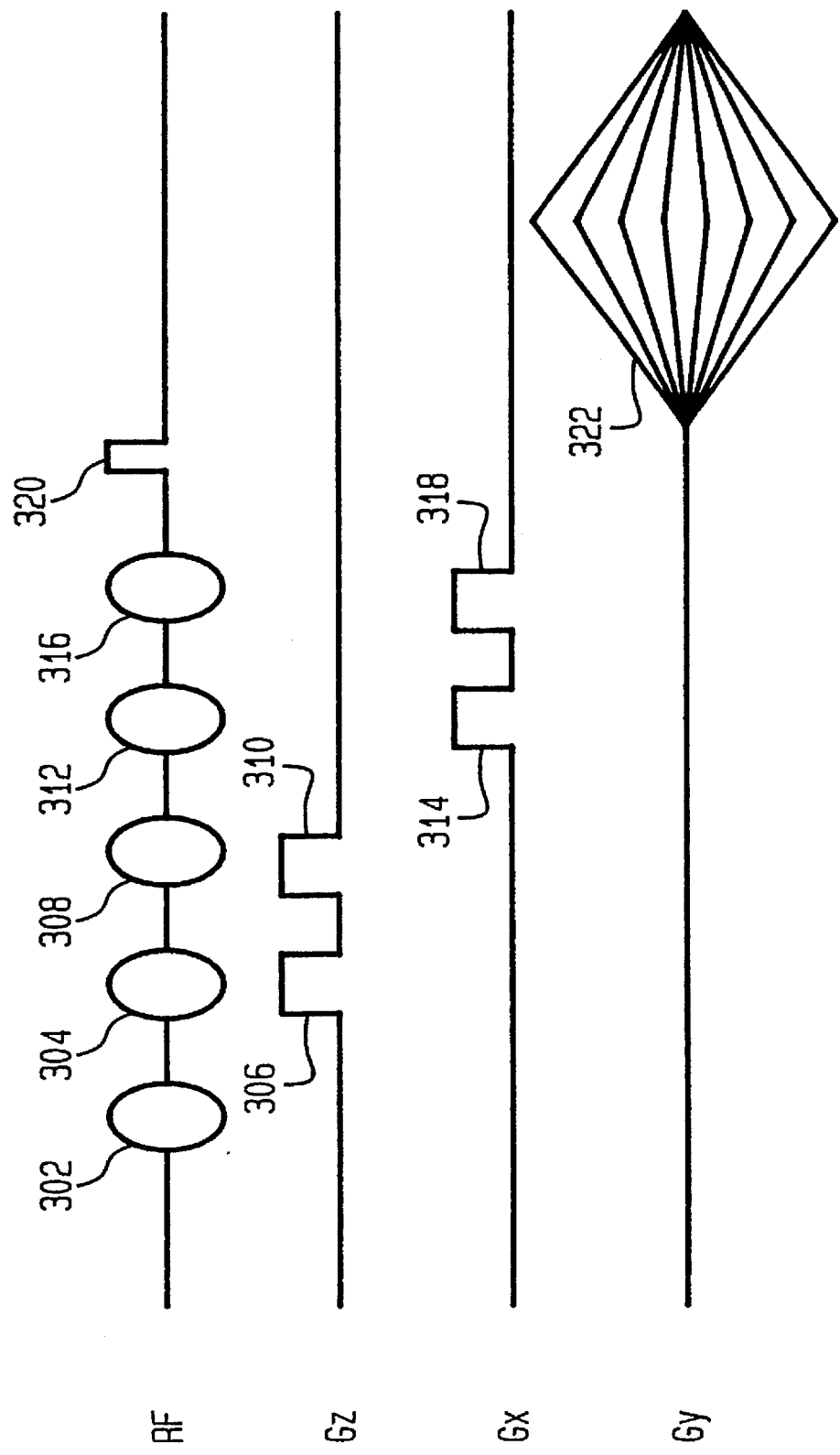
FIG. 3 shows a saturation selective pulse sequence according to an embodiment of the present invention with four saturation regions and one dimensional phase encoding.

A portion of the examination subject 5 is shown in FIG. 2. The examination subject 5 lies on a patient support 20. An organ 5a (for example, the liver, prostate or heart) is to be spectroscopically examined. For this purpose, the subject 5 is irradiated with an RF and gradient pulse sequence as shown in FIG. 3. Those of skill in the art will recognize that the pulse sequence of FIG. 3 is shown schematically and that other pulses, such as refocusing and spoiling gradients, may also be required. The pulse sequence begins with a pulse 302 designed to saturate all of the water protons in the irradiated area of the subject. This is necessary due to the signals of interest being so small that they would otherwise be obscured by the dominant water signal.

Figure 4:
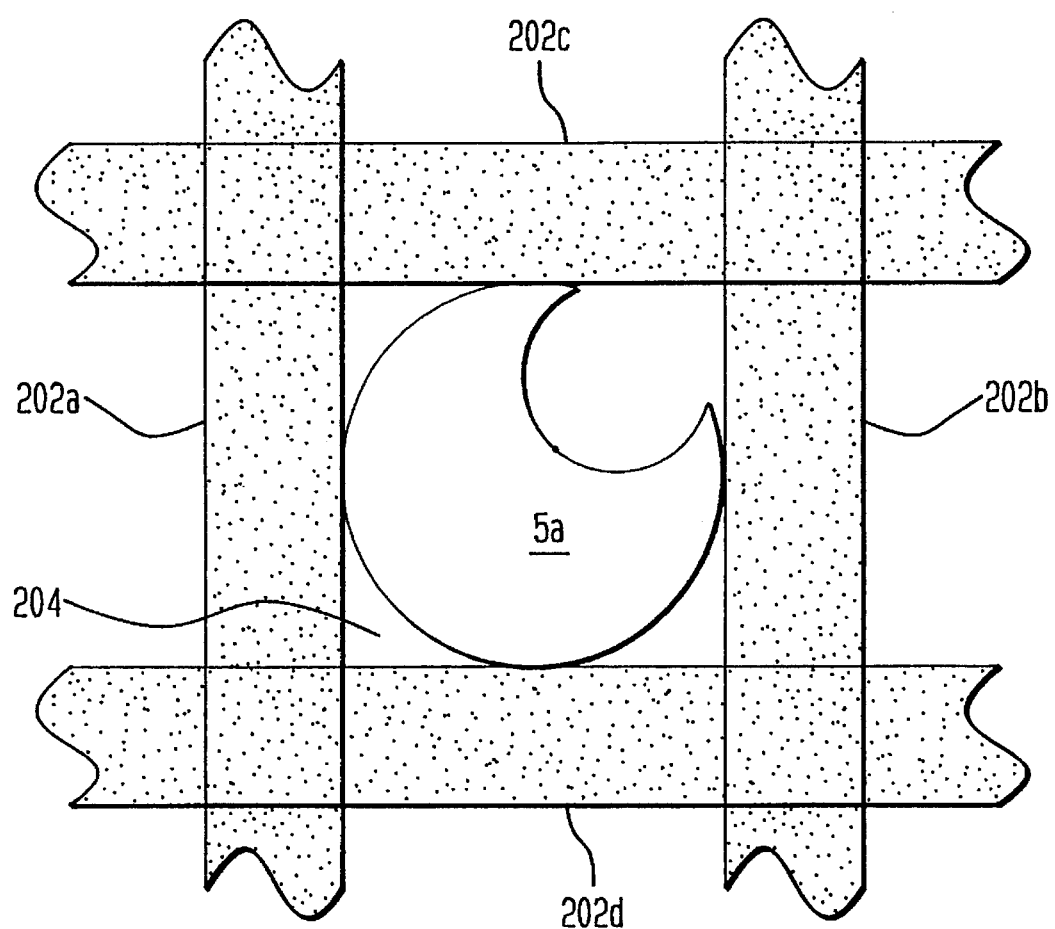
FIG. 4 shows a top view (looking down the y axis) of an acquisition slab in the examination subject of FIG. 2 with four saturation regions defining a rectangular volume of interest; and, FIG. 5 shows the FID signals which arise from the volume of interest after the sequence of FIG. 3.

The next two RF pulses 304 and 308 (under the influence of z gradients 306, 310) saturate slabs corresponding to regions 202a,b of the spins bordering the volume of interest 204. The next two RF pulses 312, 316 (under the influence of x gradients 314, 318) saturate spins in the perpendicular axis as shown in FIG. 4, 202c,d. The pulse sequence can be modified to include from 2 to 6 presaturation regions depending on the desired volume. The RF pulses can be generated by the whole body antennae 9 covering the examination subject, or by a surface coil 19 connected to the RF transmitted 15.

After saturation of the slabs 202a,b,c,d which are not to be interpreted has been completed, the examination subject 5 is excited with a further RF pulse 320 which excites the spins within the region of interest 204.

Figure 5:
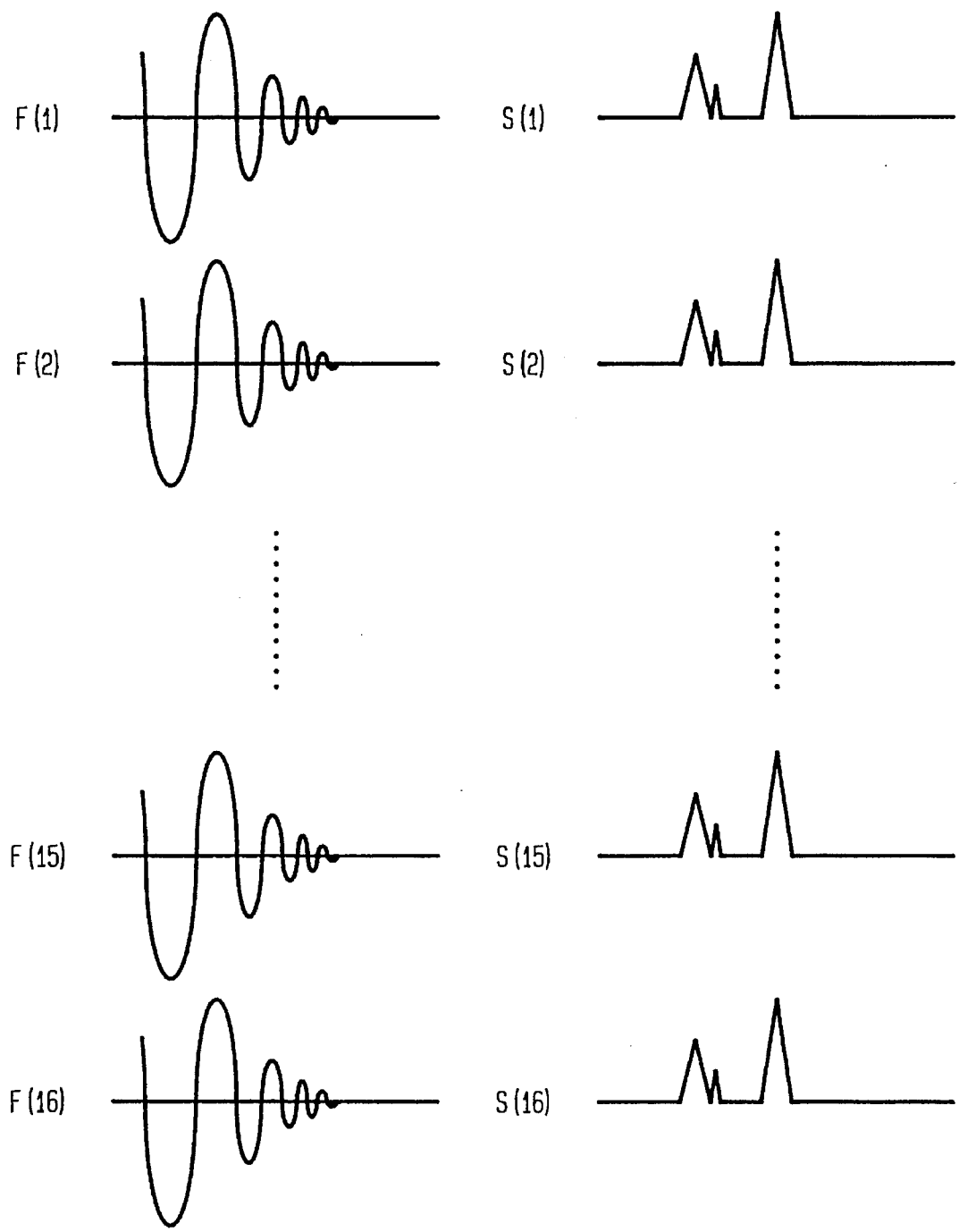

In order to further spatially localize the spins within this region, a one dimensional phase encoding gradient 322 is applied. Although shown in the y direction in FIG. 3, it should be understood that the phase encoding gradient can be in any of the x, y or z directions. The phase encoding gradient 322 is stepped up in amplitude through a series of sixteen separate acquisitions. FID signals F(1)–F(16) thus arise, which are shown in FIG. 5. A Fourier transform along the phase encoding axis then separates the FID signals F(1)–F(16) into their respective spatial locations as shown by reference numerals 204(1)–204(16) of FIG. 2. If a surface coil has been used, this FID signals in the region of interest will be acquired by the coil 19 and supplied to the control computer 17 for evaluation through the signal amplifier 14. These separate acquisitions are then post processed by a second Fourier transform (along the spectral axis) into spectra S(1)–S(16), which are used to determine metabolites within the volume of interest 204.

The above-described method can be alternatively implemented by using a spatially selective pulse in place of two of the presaturation regions. This embodiment has a time penalty, however, in that the FID acquisition takes longer when using to a spatially selective pulse.

As a further alternative, the above-described method can use specially designed RF pulses which can, in one RF pulse, saturate free form region about the region of interest.

The present method can also be extended to include the use of a special RF pulse that selectively excites only the region of interest and therefore requires no additional saturation pulses.

Now that the invention has been described by way of the preferred embodiment, various modifications, enhancements and improvements which do not depart from the scope and spirit of the invention will become apparent to those of skill in the art. Thus, it should be understood that the preferred embodiment has been provided by way of example and not by way of limitation. The scope of the invention is defined by the appended claims.

I claim:

1. A method of identifying nuclear magnetic resonance spectra in a spatially selectable examination region of an examination subject, comprising the steps of:
    a) selectively saturating solvent signals over the entire examination subject;
    b) selectively saturating volume regions of the examination subject which are not to be evaluated;
    c) applying an RF readout pulse so as to generate an FID signal;
    d) for each of steps a, b and c applying a field gradient pulse so as to phase encode examination region signals;
    e) transforming the phase encoded signals to their respective spatial locations; and,
    f) transforming the FID signal into spectral data corresponding to the examination region.

2. The method of claim 1 wherein step (b) comprises the step of saturating a rectangular area surrounding four sides of the examination region.

3. The method of claim 1 wherein the RF readout pulse of step (c) is a non-selective pulse.

4. The method of claim 1 wherein the RF readout pulse of step c is a spatially selective pulse and wherein step (b) comprises the step of saturating slabs on two sides of the examination region.

* * * * *